United States Patent
Jang et al.

(10) Patent No.: US 12,328,978 B2
(45) Date of Patent: Jun. 10, 2025

(54) UV LED WITH ELECTRODE WITH IRREGULAR SURFACE

(71) Applicant: Seoul Viosys Co., Ltd., Ansan-si (KR)

(72) Inventors: Seong Kyu Jang, Ansan-si (KR); Ju Yong Park, Ansan-si (KR); Kyu Ho Lee, Ansan-si (KR); Joon Hee Lee, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 202 days.

(21) Appl. No.: 17/880,614

(22) Filed: Aug. 3, 2022

(65) Prior Publication Data

US 2022/0376142 A1    Nov. 24, 2022

Related U.S. Application Data

(60) Continuation of application No. 16/830,191, filed on Mar. 25, 2020, now Pat. No. 11,515,450, which is a
(Continued)

(30) Foreign Application Priority Data

Dec. 23, 2016    (KR) .................. 10-2016-0178046

(51) Int. Cl.
*H01L 33/40* (2010.01)
*H01L 33/38* (2010.01)
(Continued)

(52) U.S. Cl.
CPC ........ *H10H 20/835* (2025.01); *H10H 20/831* (2025.01); *H10H 20/857* (2025.01);
(Continued)

(58) Field of Classification Search
CPC .................................................. H01L 33/405
See application file for complete search history.

(56) References Cited

U.S. PATENT DOCUMENTS 8,822,976 B2    9/2014    Inazu et al.
9,112,115 B2    8/2015    Inazu et al.
(Continued)

FOREIGN PATENT DOCUMENTS

CN    103579440 A  *  2/2014  ............. H01L 33/38
KR    20100129825 A  *  12/2010
KR    20150033478 A  *  4/2015

OTHER PUBLICATIONS

Non-Final Office Action dated Dec. 27, 2019, issued in U.S. Appl. No. 15/851,468.
(Continued)

*Primary Examiner* — Peter Bradford
(74) *Attorney, Agent, or Firm* — Oblon, McClelland, Maier & Neustadt, L.L.P.

(57) ABSTRACT

A semiconductor light emitting device includes: a first semiconductor layer; an active layer disposed on the first semiconductor layer to emit ultraviolet light; a second semiconductor layer disposed on the active layer; a contact electrode disposed on the first semiconductor layer; a first electrode including a plurality of metal layers having a first portion and a second portion adjacent to the first portion; and a second electrode disposed on the second semiconductor layer; a first bump disposed on the first electrode and electrically coupled to the first semiconductor layer by the first electrode; and a second bump disposed on the second electrode and electrically coupled to the second semiconductor layer by the second electrode, wherein the first semiconductor layer is formed of AlGaN and has an energy larger than the ultraviolet wavelength energy generated in the active layer, wherein the first portion of the plurality of metal layers is in contact with the contact electrode and the second portion of the plurality of metal layers is disposed on and in contact with first semiconductor layer, and all of the
(Continued)

plurality of metal layers have irregular top surfaces, respectively.

13 Claims, 13 Drawing Sheets

Related U.S. Application Data division of application No. 15/851,468, filed on Dec. 21, 2017, now abandoned.

(51) Int. Cl.
    *H01L 33/62*     (2010.01)
    *H10H 20/831*     (2025.01)
    *H10H 20/832*     (2025.01)
    *H10H 20/857*     (2025.01)
    *H10H 20/01*     (2025.01)
    *H10H 20/812*     (2025.01)
    *H10H 20/819*     (2025.01)
    *H10H 20/825*     (2025.01)
    *H10H 20/833*     (2025.01)

(52) U.S. Cl.
    CPC ....... *H10H 20/032* (2025.01); *H10H 20/0364* (2025.01); *H10H 20/812* (2025.01); *H10H 20/819* (2025.01); *H10H 20/825* (2025.01); *H10H 20/833* (2025.01)

(56) References Cited

U.S. PATENT DOCUMENTS

| | | | |
|---|---|---|---|
| 9,293,644 B2 | 3/2016 | Katona et al. | |
| 9,570,660 B2 | 2/2017 | Sim et al. | |
| 2003/0141506 A1* | 7/2003 | Sano | A61K 40/4272 |
| | | | 257/E33.068 |
| 2009/0057707 A1* | 3/2009 | Katsuno | H10H 20/835 |
| | | | 438/22 |
| 2010/0051987 A1* | 3/2010 | Katsuno | H10H 20/812 |
| | | | 257/98 |
| 2010/0314657 A1* | 12/2010 | Hsieh | H10D 62/056 |
| | | | 257/E33.064 |
| 2011/0133231 A1* | 6/2011 | Choi | H10H 20/82 |
| | | | 257/E33.074 |
| 2013/0153945 A1 | 6/2013 | Kobayashi et al. | |
| 2013/0328013 A1* | 12/2013 | Inazu | H10H 20/814 |
| | | | 257/13 |
| 2014/0034981 A1* | 2/2014 | Hung | H10H 20/831 |
| | | | 257/98 |
| 2015/0048304 A1 | 2/2015 | Niwa et al. | |

OTHER PUBLICATIONS

Final Office Action dated Aug. 21, 2019, issued in U.S. Appl. No. 15/851,468.
Non-Final Office Action dated Mar. 11, 2019, issued in U.S. Appl. No. 15/851,468.
Final Office Action dated Nov. 30, 2018, issued in U.S. Appl. No. 15/851,468.
Notice of Allowance issued Oct. 7, 2022, in U.S. Appl. No. 16/830,191.

* cited by examiner

UV LED WITH ELECTRODE WITH IRREGULAR SURFACE

CROSS REFERENCE TO RELATED APPLICATIONS

This application is a continuation of U.S. patent application Ser. No. 16/830,191, filed on Mar. 25, 2020, which is a divisional of U.S. patent application Ser. No. 15/851,468, filed on Dec. 21, 2017, and claims priority from and the benefit of Korean Patent Application No. 10-2016-0178046 filed on Dec. 23, 2016, which is hereby incorporated by reference for all purposes as if fully set forth herein.

BACKGROUND

Field

Implementations of the invention relate generally to an electronic device and, more particularly, to a semiconductor light emitting device including a light emitting structure, such as a light emitting diode, capable of emitting deep ultraviolet light.

Discussion of the Background

Semiconductor light emitting diodes (LEDs) are devices in which light is emitted by a material contained in a device using electric energy, and have inorganic semiconductors emitting light generated by recombination of electrons and holes. Semiconductor light emitting diodes (LEDs) have a number of advantages over filament-based light sources, such as long lifetime, low power, and good initial drive characteristics, and thus their demand is continuously increasing. For example, semiconductor light emitting diodes are used in displays, backlight units for liquid crystal displays (LCDs), lightings, and the like, and their use is expanding into various fields.

In recent years, semiconductor light emitting devices that emit deep ultraviolet (DUV) light of 365 nm or less have been developed. DUV semiconductor light emitting devices can be applied to optical sensors such as air and water sterilization, surface contaminant removal, bio-agent detectors, UV curing of polymer, and medical and analytical equipment, and the like.

In general, UV semiconductor light emitting devices have a structure in which a multiple quantum well structure including a gallium nitride-based well layer containing aluminum (Al) is interposed between an n-type AlGaN layer and a p-type AlGaN layer in order to emit light having a short wavelength. On the other hand, since AlGaN layer generally does not make an Ohmic contact with metal, a four-component AlInGaN p-type contact layer having a low GaN or Al content has been used. Since this p-type contact layer is not transparent to UV, UV light is emitted through a transparent substrate using a flip chip bonding technique. However, since a significant amount of light emitted from the multiple quantum well structure is absorbed in the p-type contact layer, light efficiency of conventional UV semiconductor light emitting devices has been very low.

The above information disclosed in this Background section is only for understanding of the background of the inventive concepts, and, therefore, it may contain information that does not constitute prior art.

SUMMARY

Implementations of semiconductor light emitting devices constructed according to the principles of the invention are particularly adapted to emit DUV light and improve forward voltage characteristics and light efficiency. For example, to facilitate emission of DUV light and improve Ohmic contact characteristics, one or more of the internal layers, such as the contact electrode, may be partially alloyed such that the amount of aluminum varies according to the depth of the layer.

According to one aspect of the invention, a semiconductor light emitting device includes a first semiconductor layer, an active layer disposed on the first semiconductor layer to emit ultraviolet light, a second semiconductor layer disposed on the active layer, and a first electrode disposed on the first semiconductor layer and being in Ohmic contact with a portion of the first semiconductor layer, the first electrode including a contact electrode including aluminum (Al) and at least one other material and having a first region adjacent to the first semiconductor layer and a second region, with each region having an Al composition ratio defined by the amount of Al relative to the amount of the at least one other material, wherein the Al composition ratio of the first region is greater than the Al composition ratio of the second region, and a metal layer disposed on the contact electrode.

The first region may include a bottom surface and the second region may include a top surface of the contact electrode At least one of the first region and the second region may have a thickness of about one half of the total thickness of the contact electrode.

The contact electrode may include at least one material selected from the group consisting of Cr, Ti, Al, Au, and combinations thereof, or an alloy of the material.

At least one of the first semiconductor layer and the active layer may include Al The metal layer may include a reflective layer to reflect light, and a barrier layer disposed on the reflective layer to prevent diffusion of metal atoms or metal ions from the reflective layer.

The reflective layer may include at least one of Al, Al alloy, Ag, and Ag alloy, and the barrier layer may include at least one of W, TiW, Mo, Ti, Cr, Pt, Rh, Pd, and Ni.

A contact resistance between the first semiconductor layer and the contact electrode may be different from a contact resistance between the first semiconductor layer and the metal layer.

The semiconductor light emitting device may further include a second electrode being in Ohmic contact with the second semiconductor layer.

The semiconductor light emitting device may further include a first pad electrically connected to the first electrode and disposed on the first electrode, and a second pad electrically connected to the second electrode and disposed on the second electrode.

The semiconductor light emitting device may further include a first bump electrically connected to the first electrode and disposed on the first electrode, and a second bump electrically connected to the second electrode and disposed on the second electrode.

The semiconductor light emitting device may further include an insulating layer disposed on the first pad and the second pad such that at least a part of the first pad and the second pad are exposed.

The semiconductor light emitting device may further include a first bump electrically connected to the first electrode and disposed on the first electrode, and a second bump electrically connected to the second electrode and disposed on the second electrode.

According to another aspect of the invention, a semiconductor light emitting device includes a first semiconductor layer, an active layer disposed on the first semiconductor layer to emit ultraviolet light, a second semiconductor layer disposed on the active layer, and a first electrode disposed on the first semiconductor layer and including a plurality of metal layers, with one of the plurality of metal layers having a relatively planar lower surface and an irregular top surface, the lower surface being in Ohmic contact with the first semiconductor layer.

The one metal layer may include a contact electrode in Ohmic contact with a portion of the first semiconductor layer, other of the plurality of the metal layers may be electrically connected to the contact electrode, and at least a part of the other metal layer may be disposed on and in contact with the first semiconductor layer.

The contact electrode may have a width shorter than a width over which the other metal layer and the first semiconductor layer are in contact with each other.

The other metal layer may surround the contact electrode.

The other metal layer may include a reflective layer to reflect light, and a barrier layer disposed on the reflective layer to prevent diffusion of metal atoms or metal ions from the reflective layer.

The semiconductor light emitting device may further include a second electrode being in Ohmic contact with the second semiconductor layer.

The semiconductor light emitting device may further include a first bump electrically connected to the first electrode and disposed on the first electrode, and a second bump electrically connected to the second electrode and disposed on the second electrode.

According to still another aspect of the invention, a semiconductor light emitting device includes: a substrate; a first semiconductor layer on the substrate; an active layer disposed on the first semiconductor layer to emit ultraviolet light; a second semiconductor layer disposed on the active layer; a first electrode disposed on the first semiconductor layer and being in contact with a portion of the first semiconductor layer, the first electrode comprising a contact electrode formed as alloyed layers and a metal layer covering the contact electrode; a second electrode disposed on the second semiconductor layer; a first bump electrically connected to the first electrode; and a second bump electrically connected to second electrode. The metal layer is formed as a multi-layer structure, the contact electrode surrounds the active layer in a plan view; and a contact area between the contact electrode and the first semiconductor layer is smaller than a contact area between the metal layer and the first semiconductor layer.

A width over which the contact electrode contacts the first semiconductor layer may be shorter than a width over which the metal layer contacts the first semiconductor layer.

The contact electrode may be configured to absorb the ultraviolet light reflected from the substrate.

The contact electrode may be closer to the second electrode than the first bump.

The metal layer may include a reflective layer and a conductive barrier layer disposed on the reflective layer.

The reflective layer may include aluminum (Al).

The conductive barrier layer may include at least one of W, TiW, Mo, Ti, Cr, Pt, Rh, Pd and Ni; and the conductive barrier layer may be formed as a multilayer structure.

The metal layer may contact a side surface of the first semiconductor layer.

The semiconductor light emitting device may further include a first electrode pad disposed between the metal layer and the first bump; and a second electrode disposed between a second electrode and a second bump.

The semiconductor light emitting device may further include an insulating layer disposed on the first electrode and the second electrode pad. The insulating layer may include a first opening exposing an upper surface of the first electrode pad and a second opening exposing an upper surface of the second electrode pad.

The first bump may be disposed in the first opening and the second bump may be disposed in the second opening.

The insulating layer may overlap the contact electrode.

The first bump may be disposed on an area which the metal layer may directly contact the first semiconductor layer.

The contact electrode may have a relatively planar lower surface and an irregular top surface, the lower surface being in Ohmic contact with the first semiconductor layer.

The second electrode may include Ni/Au or a transparent electrode may be formed as an Indium Tin Oxide.

According to another aspect to the invention, a semiconductor light emitting device includes: a first semiconductor layer; an active layer disposed on the first semiconductor layer to emit ultraviolet light; a second semiconductor layer disposed on the active layer; a contact electrode disposed on the first semiconductor layer; a first electrode including a plurality of metal layers having a first portion and a second portion adjacent to the first portion; and a second electrode disposed on the second semiconductor layer; a first bump disposed on the first electrode and electrically coupled to the first semiconductor layer by the first electrode; and a second bump disposed on the second electrode and electrically coupled to the second semiconductor layer by the second electrode, wherein the first semiconductor layer is formed of AlGaN and has an energy larger than the ultraviolet wavelength energy generated in the active layer, wherein the first portion of the plurality of metal layers is in contact with the contact electrode and the second portion of the plurality of metal layers is disposed on and in contact with first semiconductor layer, and all of the plurality of metal layers have irregular top surfaces, respectively.

The contact electrode may have relatively planar lower surface and an irregular top surface, the lower surface being in ohmic contact with the first semiconductor layer.

The contact electrode may have a width shorter than a width over which the plurality of metal layers and the first semiconductor layer are in contact with each other.

The plurality of metal layers may surround the contact electrode.

The plurality of metal layers may include: a reflective layer to reflect light; and a barrier layer disposed on the reflective layer to prevent diffusion of metal atoms or metal ions from the reflective layer.

The reflective layer may include aluminum (Al), and the barrier layer includes at least one of W, TiW, Mo, Ti, Cr, Pt, Rh, Pd and Ni.

The second electrode may be in Ohmic contact with the second semiconductor layer.

According to another aspect to the invention, a semiconductor light emitting device includes: a first semiconductor layer; an active layer disposed on the first semiconductor layer to emit ultraviolet light; a second semiconductor layer disposed on the active layer; a contact electrode disposed on the first semiconductor layer; a first electrode including a metal layer having a first portion and a second portion adjacent to the first portion; and a second electrode disposed on the second semiconductor layer; a first bump disposed on the first electrode and electrically coupled to the first semiconductor layer by the first electrode; and a second bump disposed on the second electrode and electrically coupled to the second semiconductor layer by the second electrode, wherein: the first semiconductor layer is formed of AlGaN and has an energy larger than the ultraviolet wavelength energy generated in the active layer, the active layer includes a quantum well layer and a quantum barrier layer alternately stacked and each of the quantum well layer and the quantum barrier layer includes materials having different compositions, and have a composition formula of InxAlyGa1-x-yN (0≤x≤1, 0≤y≤1, 0≤x+y≤1), and the first portion of the metal layer is in contact with the contact electrode and has an irregular surface, and the second portion of metal layer is disposed on and in contact with first semiconductor layer.

The contact electrode may be configured to absorb the ultraviolet light.

The contact electrode may be closer to the second electrode than the first bump.

The metal layer may include a reflective layer including aluminum (Al).

The device may further include at least one conductive barrier layer disposed on the reflective layer to prevent diffusion of metal atoms or metal ions from the reflective layer.

The at least one conductive barrier layer may include at least one of W, TiW, Mo, Ti, Cr, Pt, Rh, Pd and Ni.

The metal layer may contact a side surface of the first semiconductor layer.

According to another aspect to the invention, a semiconductor light emitting device includes: a first semiconductor layer; an active layer disposed on the first semiconductor layer to emit ultraviolet light; a second semiconductor layer disposed on the active layer; a first electrode disposed on the first semiconductor layer and including a contact electrode; and a second electrode disposed on the second semiconductor layer; wherein: the first semiconductor layer is formed of AlGaN and has an energy larger than the ultraviolet wavelength energy generated in the active layer, the active layer includes a quantum well layer and a quantum barrier layer alternately stacked and each of the quantum well layer and the quantum barrier layer includes materials having different compositions, and have a composition formula of InxAlyGa1-x-yN (0≤x≤1, 0≤y≤1, 0≤x+y≤1), and the contact electrode has an irregular top surface and an opposite surface of the irregular top surface in ohmic with the first semiconductor layer.

The first electrode may further include a metal layer having a first portion and a second portion adjacent to the first portion.

The first portion of the metal layer may be in contact with the contact electrode and having an irregular surface, and the second portion of metal layer is disposed on and in contact with first semiconductor layer.

The metal layer may include a reflective layer including aluminum (Al).

The first electrode may further include at least one conductive barrier layer disposed on the reflective layer to prevent diffusion of metal atoms or metal ions from the reflective layer.

The at least one conductive barrier layer may include at least one of W, TiW, Mo, Ti, Cr, Pt, Rh, Pd and Ni.

Additional features of the inventive concepts will be set forth in the description which follows, and in part will be apparent from the description, or may be learned by practice of the inventive concepts.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION OF THE ILLUSTRATED EMBODIMENTS

Figure 1:
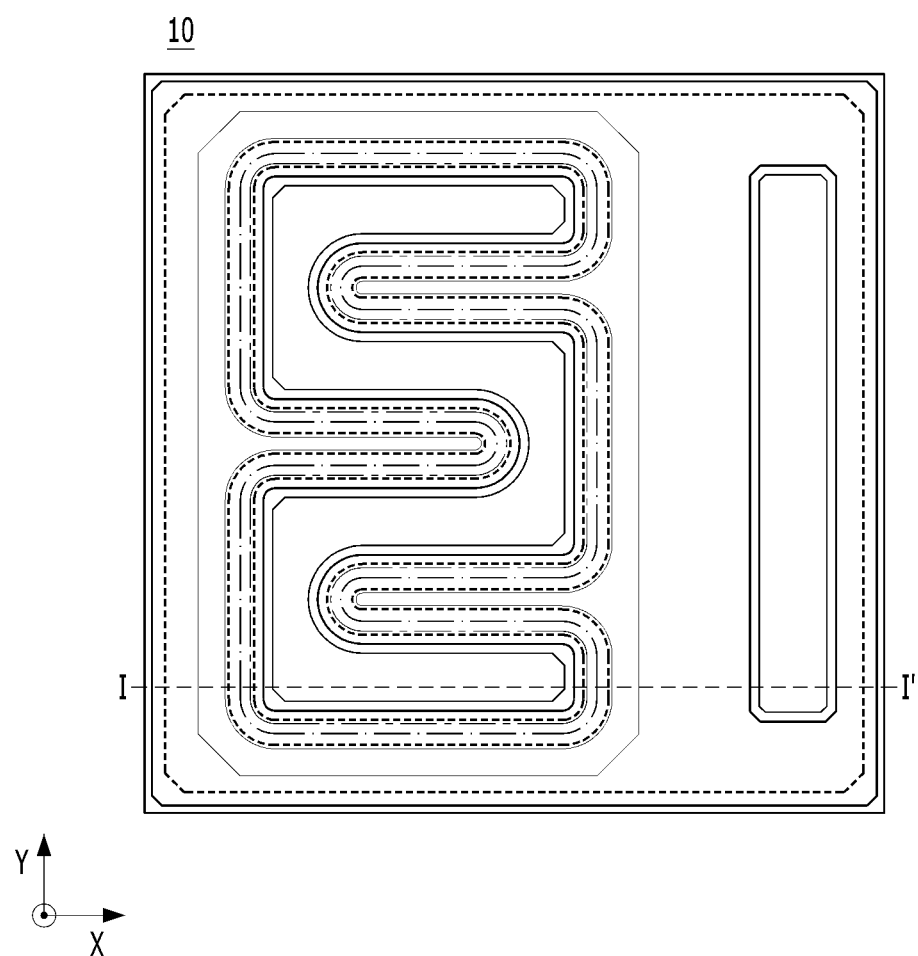
FIG. 1 is a schematic plan view of an embodiment of a semiconductor light emitting device constructed according to the principles of the invention.

In the following description, for the purposes of explanation, numerous specific details are set forth in order to provide a thorough understanding of various embodiments or implementations of implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
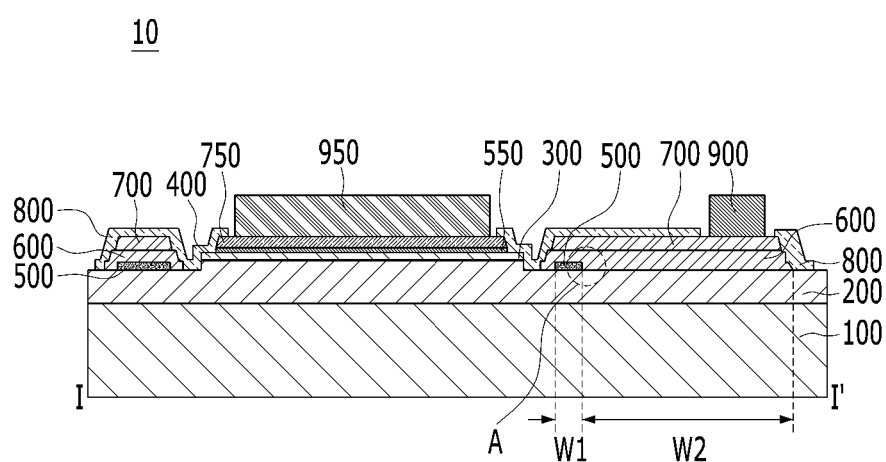
FIG. 2 is a cross-sectional view taken along sectional line I-I' of the semiconductor light emitting device of FIG. 1.

FIG. 1 is a schematic plan view of an embodiment of a semiconductor light emitting device constructed according to the principles of the invention. FIG. 2 is a cross-sectional view taken along sectional line I-I' of the semiconductor light emitting device of FIG. 1.

Referring to FIGS. 1 and 2, semiconductor light emitting device 10 includes substrate 100, first conductive semiconductor layer 200, active layer 300, second conductive semiconductor layer 400, contact electrode 500, second electrode 550, metal layer 600, first electrode pad 700, second electrode pad 750, insulating layer 800, first bump 900, and second bump 950.

Substrate 100 may be made of a material suitable for growing a nitride semiconductor single crystal. For example, substrate 100 may be formed using a material such as sapphire, zinc oxide (ZnO), gallium nitride (GaN), silicon carbide (SiC), aluminum nitride (AlN) or the like.

A buffer layer may be formed on an upper surface of substrate 100 to reduce the difference in lattice constant between substrate 100 and first conductive semiconductor layer 200. The buffer layer may be made of a material such as GaN, AlN, AlGaN, InGaN, AlGaInN or the like, and may be omitted depending on the desired characteristics of a semiconductor light emitting device and manufacturing process conditions.

First conductive semiconductor layer 200 is disposed on an upper surface of substrate 100 (or the buffer layer). First conductive semiconductor layer 200 is a nitride semiconductor containing an n-type impurity and may have a compositional formula of AlxInyGa1-x-yN (0≤x<1, 0≤y<1, 0≤x+y<1). For example, first conductive semiconductor layer 120 may include GaN, AlGaN, InGaN, AlInGaN, and the like. In an embodiment, first conductive semiconductor layer 200 may be formed of AlGaN. Active layer 300 is made of AlGaN to generate UV wavelength light, and AlGaN having energy larger than UV wavelength energy may be used as first conductive semiconductor layer 200 to prevent the UV wavelength light generated in active layer 300 from being absorbed by first conductivity type semiconductor layer 200.

Active layer 300 is disposed on first conductive semiconductor layer 200. In an embodiment, active layer 300 may have a multi quantum well (MQW) structure in which a quantum well layer and a quantum barrier layer are alternately stacked. For example, each of the quantum well layer and the quantum barrier layer includes materials having different compositions, and may have a composition formula of InxAlyGa1-x-yN (0≤x≤1, 0≤y≤1, 0≤x+y≤1). The quantum well layer may include a highly volatile material such as indium (In). For example, the quantum well layer may include InxGa1-xN (0<x≤1) and the quantum barrier layer may include GaN or AlGaN. In an embodiment, active layer 300 may be made of AlGaN to generate the UV wavelength light.

Second conductive semiconductor layer 400 is disposed on active layer 300. Second conductive semiconductor layer 400 is a p-type nitride semiconductor and may have a composition formula of AlxInyGa1-x-yN (0≤x<1, 0≤y<1, 0≤x+y<1). For example, second conductive semiconductor layer 400 may include AlGaN, GaN, or the like. For example, the p-type impurity may be Mg. In an embodiment, second conductive semiconductor layer 400 may be composed of GaN for improving Ohmic contact characteristics with Ni/Au or a transparent electrode (ITO) generally used as a second electrode 550.

The first electrode is disposed on first conductive semiconductor layer 200. The first electrode may include contact electrode 500 and metal layer 600.

Contact electrode 500 may be in an Ohmic contact with a portion of first conductive semiconductor layer 200. In an embodiment, contact electrode 500 may comprise at least one of Cr, Ti, Al, Au and combinations thereof, or may be a multi-layer structure of Cr/Ti/Al/Ti/Au. In the case of contact electrode 500 having the above-described multilayer structure, Cr may have a thickness of about 50 angstroms, Ti may have a thickness of about 200 angstroms, Al may have a thickness of about 600 angstroms, Ti may have a thickness of about 200 angstroms, and Au may have a thickness of about 1000 angstroms. However, they are not limited to the above-described thicknesses.

Metal layer 600 is disposed on contact electrode 500. Metal layer 600 may be electrically connected to contact electrode 500, and at least a part of metal layer 600 may be disposed on and in contact with first conductive semiconductor layer 200. In an embodiment, metal layer 600 may be in the form of surrounding contact electrode 500.

The light efficiency of semiconductor light emitting device 10 can be improved by increasing the area of metal layer 600 that reflects the UV light and by reducing the area of contact electrode 500 that absorbs the UV light reflected from substrate 100. The contact area between contact electrode 500 and first conductive semiconductor layer 200 may be smaller than the contact area between metal layer 600 and first conductive semiconductor layer 200. Referring to FIG. 2, the width W1 over which contact electrode 500 contacts first conductive semiconductor layer 200 may be shorter than the width W2 over which metal layer 600 contacts first conductive semiconductor layer 200.

Second electrode 550 is disposed on second conductive semiconductor layer 400. Second electrode 550 may include Ni/Au or a transparent electrode (ITO). In an embodiment, second electrode 550 is processed using a heat treatment at a high temperature of about 590 degrees Celsius to improve Ohmic contact characteristics with second conductive semiconductor layer 400. Second electrode 550 may be partially alloyed and may form an Ohmic contact with second conductive semiconductor layer 400.

First electrode pad 700 is electrically connected to the first electrode and is disposed on metal layer 600. Second electrode pad 750 is electrically connected to second electrode 550 and disposed on second electrode 550.

First electrode pad 700 and second electrode pad 750 may function to effectively connect the first electrode and second electrode 550 to the circuit board. In an embodiment, first electrode pad 700 and second electrode pad 750 may be formed together using substantially the same process, for example, using photo and etch techniques or lift-off techniques. In an embodiment, first electrode pad 700 and second electrode pad 750 may include at least one of Ti and Au, or may have a multilayer structure of Ti/Au/Ti. When first electrode pad 700 and second electrode pad 750 have the above-described multi-layer structure, the first Ti layer may have a thickness of about 300 angstroms, the Au layer may have a thickness of about 3000 angstroms, and the second Ti layer may have a thickness of about 50 angstroms. The thickness of first electrode pad 700 and second electrode pad 750 may be varied depending on the thickness of metal layer 600 and second electrode 550.

Insulating layer 800 is disposed on first electrode pad 700 and second electrode pad 750 such that at least a portion of first electrode pad 700 and second electrode pad 750 are exposed.

Insulating layer 800 may partially cover a light emitting structure composed of the first electrode, second electrode 550 and first conductive semiconductor layer 200, active layer 300, and second conductive semiconductor layer 400. Insulating layer 160 electrically isolates the first electrode and second electrode 550 from each other and protects the first electrode and second electrode 550 from external impact and contaminants. In an embodiment, insulating layer 800 may comprise a silicon oxide layer and/or a silicon nitride layer.

First bump 900 is electrically connected to the first electrode and is disposed on first electrode pad 700. Second bump 950 is electrically connected to second electrode 550 and is disposed on second electrode pad 750. In an embodiment, first bump 900 is electrically connected to the first electrode and is disposed on insulating layer 800, and second bump 950 is electrically connected to second electrode 550 and is disposed on insulating layer 800.

First bump 900 and second bump 950 may function to effectively connect first electrode and second electrode 550 to the circuit board. In an embodiment, first bump 900 and second bump 950 may be formed together using substantially the same process. In an embodiment, first bump 900 and second bump 950 may include at least one of Ti, Au, and Cr, or may be a multilayer structure of Ti/Au/Cr/Au. When first bump 900 and second bump 950 have the above-described multi-layer structure, the Ti layer may have a thickness of about 300 angstroms, the first Au layer may have a thickness of about 20000 angstroms, the Cr layer may have a thickness of about 200 angstroms, and the second Au layer may have a thickness of about 250,000 angstroms. However, they are not limited to the above-described thicknesses.

It is to be understood that plan views of semiconductor light emitting element 10 in X direction and Y direction can be variously modified within the scope of employing embodiments of the principles of the invention. For example, the position, size, and shape of contact electrode 500 and metal layer 600 may be varied. For example, the positions, sizes, and shapes of first and second electrode pads 700, 750, first and second bumps 900, 950 may be varied.

Figure 3:
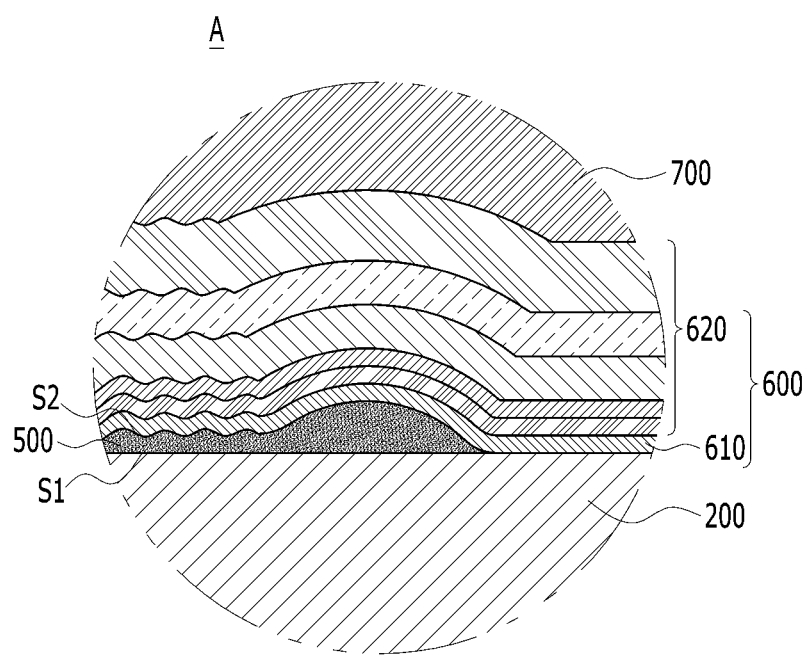
FIG. 3 is an enlarged cross-sectional view of part A of the semiconductor light emitting device of FIG. 2.

FIG. 3 is an enlarged cross-sectional view of part A of the semiconductor light emitting device of FIG. 2.

Referring to FIGS. 2 and 3, the first electrode is disposed on first conductive semiconductor layer 200, and includes contact electrode 500 and metal layer 600. Metal layer 600 is disposed on contact electrode 500 and includes reflective metal layer 610 and conductive barrier layer 620. First electrode pad 700 is disposed on metal layer 600.

Contact electrode 500 may be in an Ohmic contact with a part of first conductive semiconductor layer 200. In an embodiment, contact electrode 500 is subjected to a heat treatment at a high temperature of about 935 degrees Celsius to improve Ohmic contact characteristics with first conductive semiconductor layer 200. Contact electrode 500 may be partially alloyed and may form an Ohmic contact with first conductive semiconductor layer 200. In an embodiment, contact electrode 500 may have a non-uniform top surface characterized by varying undulations when compared to its lower surface, which is relatively flat and planar, due to the partial alloying of contact electrode 500.

Applicant's realized that the Ohmic contact between first conductive semiconductor layer 200 and contact electrode 500 should be improved to improve forward voltage (vf) characteristic of contact electrode 500 of semiconductor light emitting element 10, particularly to emit DUV light. Ohmic contact characteristics may be improved by increasing the aluminum composition of contact electrode 500 closer to the surface that contacts first conductive semiconductor layer 200. That is, the aluminum composition ratio of a first surface S1 adjacent to first conductive semiconductor layer 200 of contact electrode 500 may be larger than the aluminum composition ratio of a second surface S2 adjacent to metal layer 600 of contact electrode 500 so that the forward voltage characteristic of semiconductor light emitting element 10 may be improved. The first and second surfaces of contact electrode 500 may constitute regions each extending in the X direction up to about one half of the total thickness of contact electrode 500.

Metal layer 600 may be electrically connected to contact electrode 500, and at least a part of metal layer 600 may be disposed on and in contact with first conductive semiconductor layer 200. Conductive barrier layer 620 is disposed on reflective metal layer 610.

Reflective metal layer 610 reflects the UV light generated in active layer 300 or the UV light reflected from substrate 100. In an embodiment, reflective metal layer 610 may include at least one of Al, Al alloy, Ag and Ag alloy.

Conductive barrier layer 620 prevents diffusion of metal atoms or ions from reflective metal layer 610 to prevent movement of reflective metal layer 610. Conductive barrier layer 620 may include at least one of W, TiW, Mo, Ti, Cr, Pt, Rh, Pd and Ni, or may have a multilayer structure of Cr/Al/Ni/Ti/Ni/Ti/Au/Ti. When conductive barrier layer 620 has the above-described multilayer structure, the Cr layer may have a thickness of about 25 angstroms, the Al layer may have a thickness of about 1200 angstroms, each Ni layer may have a thickness of about 1000 angstroms, each Ti layer may have a thickness of about 1000 angstroms, and the Au layer may have a thickness of about 2800 angstroms. However, they are not limited to the above-described thicknesses.

Figure 4:
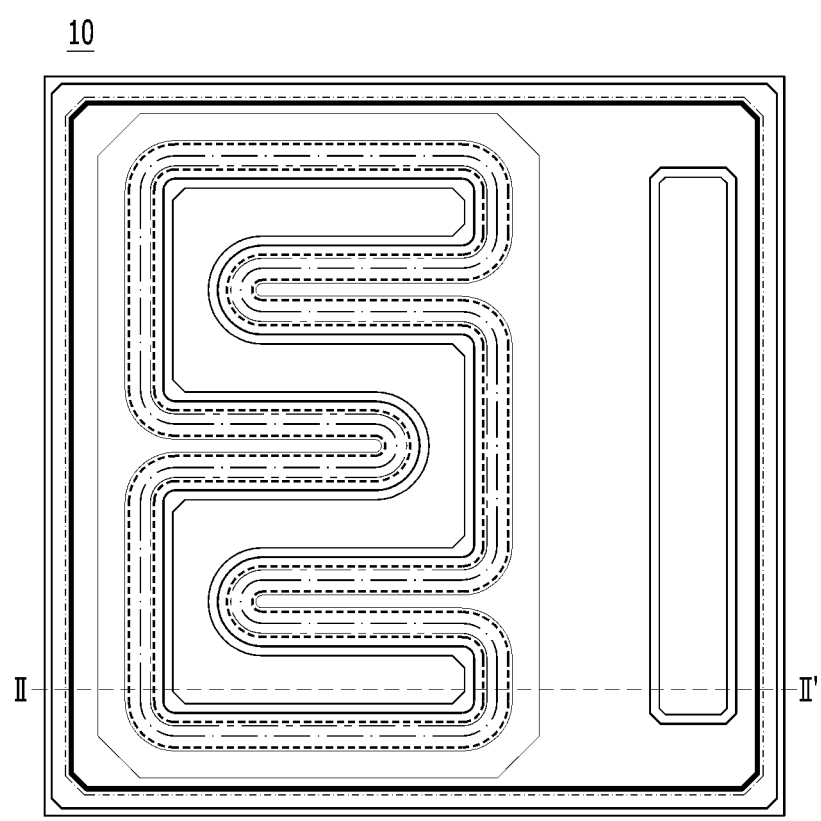
FIG. 4 is a schematic plan view of another embodiment of a semiconductor light emitting device constructed according to the principles of the invention.
Figure 5:
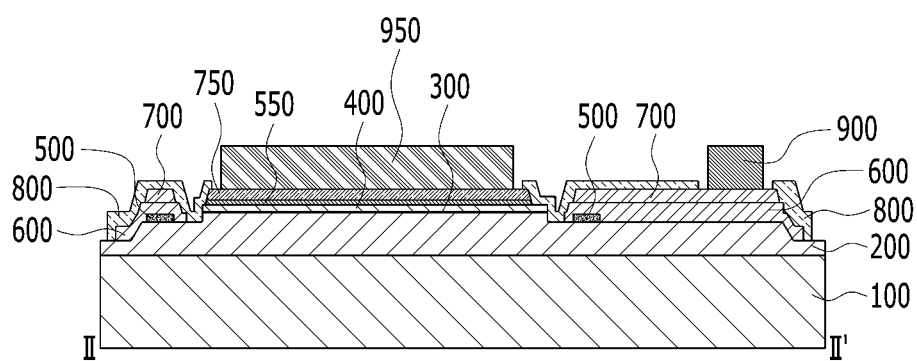
FIG. 5 is a cross-sectional view taken along sectional line II-II' of the semiconductor light emitting device of FIG. 4.

FIG. 4 is a schematic plan view of another embodiment of a semiconductor light emitting device constructed according to the principles of the invention. FIG. 5 is a cross-sectional view taken along sectional line II-II' of the semiconductor light emitting device of FIG. 4.

Referring to FIGS. 4 and 5, semiconductor light emitting device 10 includes substrate 100, first conductive semiconductor layer 200, active layer 300, second conductive semiconductor layer 400, contact electrode 500, first electrode pad 700, second electrode pad 750, insulating layer 800, first bump 900, and second bump 950.

Substrate 100, first conductive semiconductor layer 200, active layer 300, second conductive semiconductor layer 400, contact electrode 500, second electrode 550, metal layer 600, first electrode pad 700, second electrode pad 750, insulating layer 800, first bump 900, and second bump 950 are substantially the same as substrate 100, first conductive semiconductor layer 200, active layer 300, second conductive semiconductor layer 400, contact electrode 500, second electrode 550, metal layer 600, first electrode pad 700, second electrode pad 750, insulating layer 800, first bump 900, and second bump 950 described with reference to FIGS. 1 and 2. Hereinafter, a duplicate description will be omitted to avoid redundancy.

Figure 6:
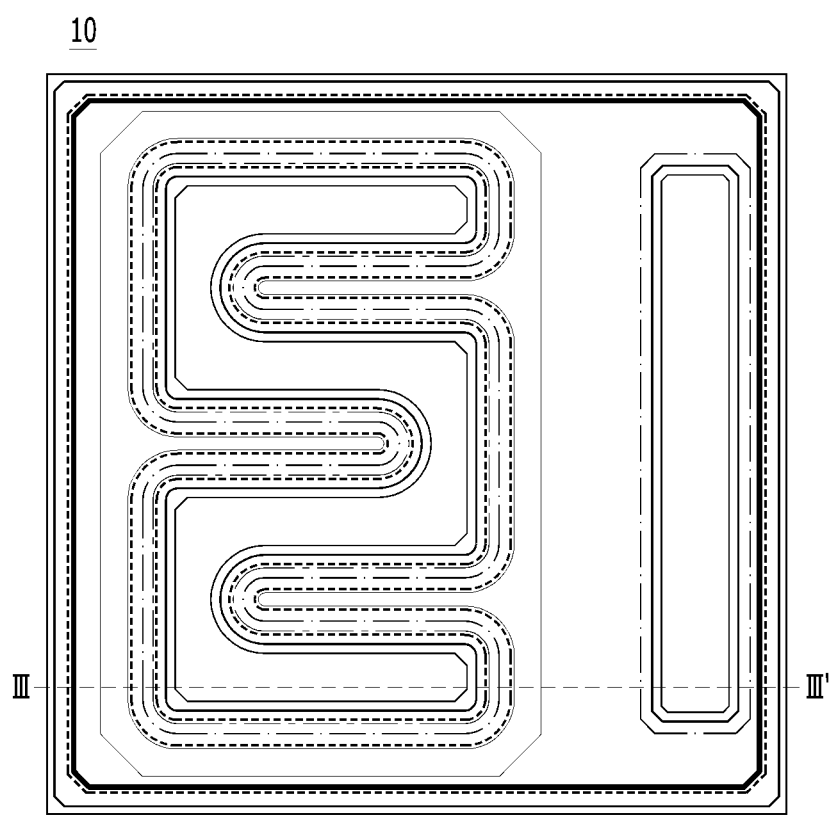
FIG. 6 is a schematic plan view of another embodiment of a semiconductor light emitting device constructed according to the principles of the invention.
Figure 7:
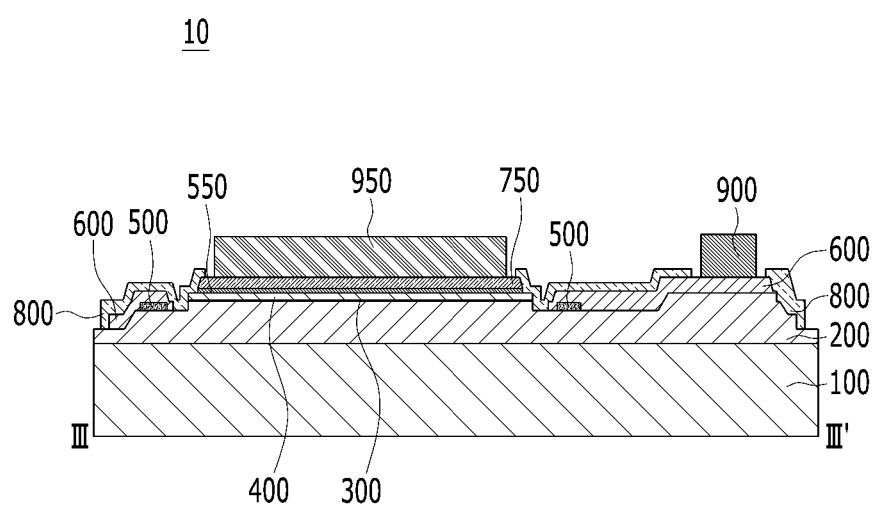
FIG. 7 is a cross-sectional view taken along sectional line III-III' of the semiconductor light emitting device of FIG. 6.

Metal layer 600 may be electrically connected to contact electrode 500, and at least a part of metal layer 600 may be disposed on and in contact with first conductive semiconductor layer 200. A part of first conductive semiconductor layer 200 disposed at both ends of first conductive semiconductor layer 200 and being distal from a part of first conductive semiconductor layer 200 disposed under second electrode 550 is further mesa-etched. Metal layer 600 is extended to and disposed on a top surface of the further mesa-etched first conductive semiconductor layer 200. Metal layer 600 may have a concave shape with contact electrode 500 and second electrode 550 as the center, and may reflect more UV light generated from active layer 300 or UV light reflected from substrate 100 to improve the light efficiency of semiconductor light emitting device 10 more effectively FIG. 6 is a schematic plan view of another embodiment of a semiconductor light emitting device constructed according to the principles of the invention. FIG. 7 is a cross-sectional view taken along sectional line III-III' of the semiconductor light emitting device of FIG. 6.

Referring to FIGS. 6 and 7, semiconductor light emitting device 10 includes substrate 100, first conductive semiconductor layer 200, active layer 300, second conductive semiconductor layer 400, contact electrode 500, second electrode 550, metal layer 600, insulating layer 800, first bump 900, and second bump 950.

Substrate 100, first conductive semiconductor layer 200, active layer 300, second conductive semiconductor layer 400, contact electrode 500, second electrode 550, metal layer 600, first bump 900 and second bump 950 are described substantially the same as substrate 100, first conductive semiconductor layer 200, active layer 300, second conductive semiconductor layer 400, contact electrode 500, second electrode 550, metal layer 600, insulating layer 800, first bump 900, and second bump 950 described with reference to FIGS. 1 and 2. Hereinafter, a duplicate description will be omitted to avoid redundancy.

Metal layer 600 may be electrically connected to contact electrode 500, and at least a part of metal layer 600 may be disposed on and in contact with first conductive semiconductor layer 200. First conductive semiconductor layer 200 disposed under second bump 950 is not mesa-etched and substantially the same height as first conductive semiconductor layer 200 disposed under the second electrode 550. A part of first conductive semiconductor layer 200 disposed at both ends of first conductive semiconductor layer 200 and being distal from a part of first conductive semiconductor layer 200 disposed under second electrode 550 is further mesa-etched. Metal layer 600 is extended to and disposed on a top surface of the further mesa-etched first conductive semiconductor layer 200. Metal layer 600 is disposed on second electrode 550, and first bump 900 and second bump 950 are disposed on metal layer 600.

Metal layer 600 may have a concave shape with contact electrode 500 and second electrode 550 as the center, and may reflect more UV light generated from active layer 300 or UV light reflected from substrate 100 to improve the light efficiency of semiconductor light emitting device 10 more effectively.

FIGS. 8, 9, 10, 11, 12, 13, 14, and 15 are schematic cross-sectional views illustrating an exemplary method of manufacturing the semiconductor light emitting device of FIGS. 1 and 2.

Figure 8:
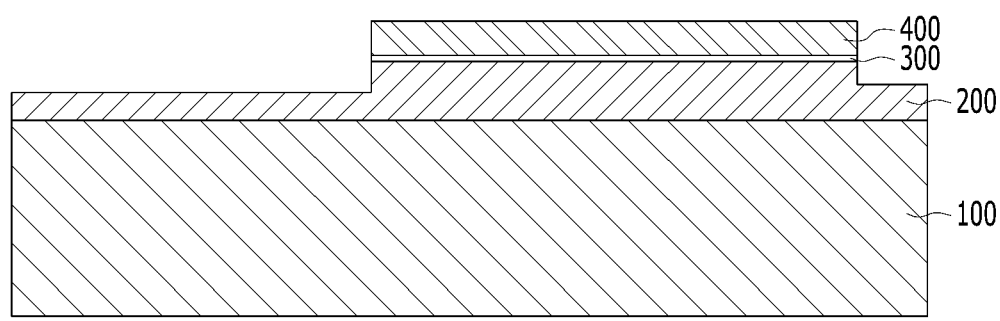
FIGS. 8, 9, 10, 11, 12, 13, 14, and 15 are schematic cross-sectional views illustrating an exemplary method of manufacturing the semiconductor light emitting device of FIGS. 1 and 2.

Referring to FIG. 8, first conductive semiconductor layer 200, active layer 300, and second conductive semiconductor layer 400 are formed on substrate 100.

Substrate 100 may be provided as a substrate for semiconductor growth, and may include at least one selected material selected from GaN, sapphire, SiC, Si, MgAl2O4, MgO, LiAlO2, LiGaO2, and the like.

First conductive semiconductor layer 200 and second conductive semiconductor layer 400 may be an n-type semiconductor layer and a p-type semiconductor layer, respectively. In an embodiment, first conductive semiconductor layer 200 may include Al.

Active layer 300 may have a multi quantum well (MQW) structure in which a quantum well layer and a quantum barrier layer are alternately stacked. In an embodiment, active layer 300 may include Al to generate UV wavelength light.

Figure 9:
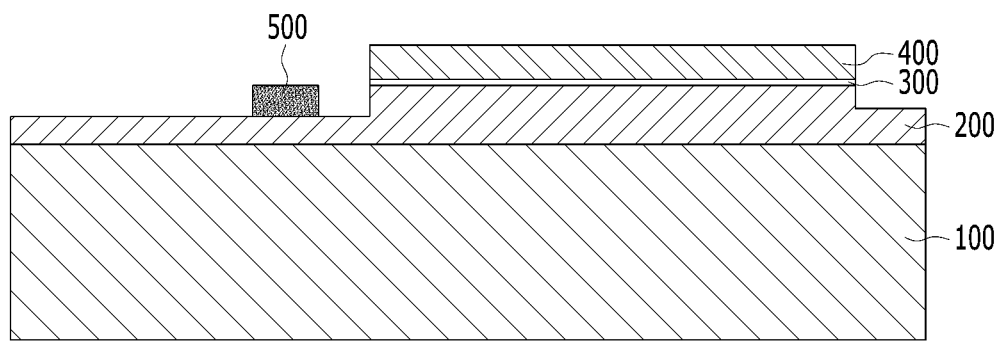

Referring to FIG. 9, contact electrode 500 is formed on first conductive semiconductor layer 200. Contact electrode 500 is formed on in an Ohmic contact with only a part of first conductive semiconductor layer 200, but is not limited thereto. In an embodiment, an Ohmic contact area between contact electrode 500 and first conductive semiconductor layer 200 may vary.

Figure 10:
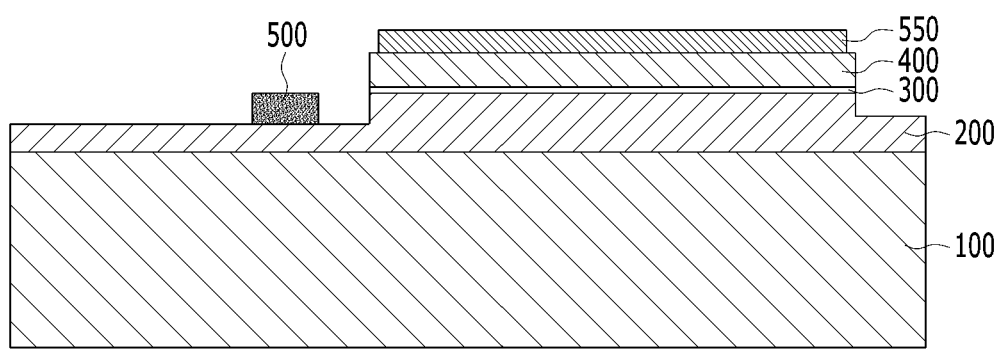

Referring to FIG. 10, second electrode 550 is formed on second conductive semiconductor layer 400. Second electrode 550 may be in an Ohmic contact with second conductive semiconductor layer 400. In an embodiment, second electrode 550 may be formed of Ni/Au or a transparent electrode (ITO) to improve Ohmic characteristics with GaN used as second conductive semiconductor layer 400.

Figure 11:
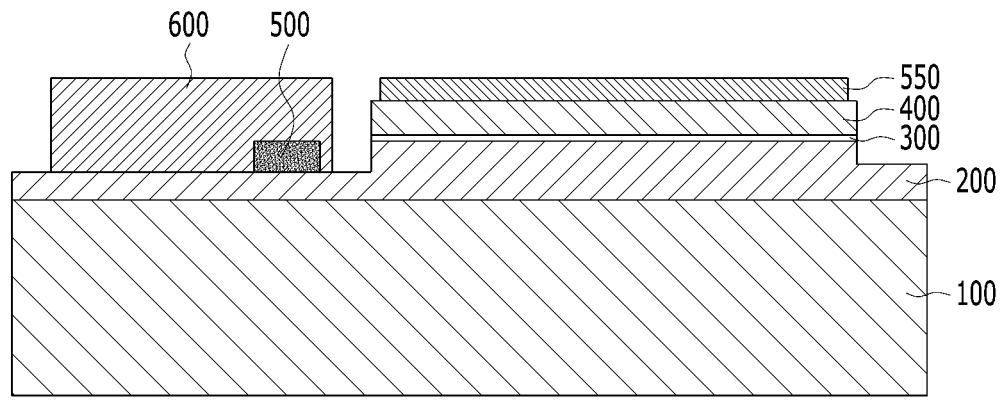

Referring to FIG. 11, metal layer 600 is formed on contact electrode 500. Metal layer 600 may be electrically connected to contact electrode 500, and at least a part of metal layer 600 may be disposed on and in contact with first conductive semiconductor layer 200. Contact resistance between first conductive semiconductor layer 200 and contact electrode 500 may be different from contact resistance between first conductive semiconductor layer 200 and metal layer 600.

Figure 12:
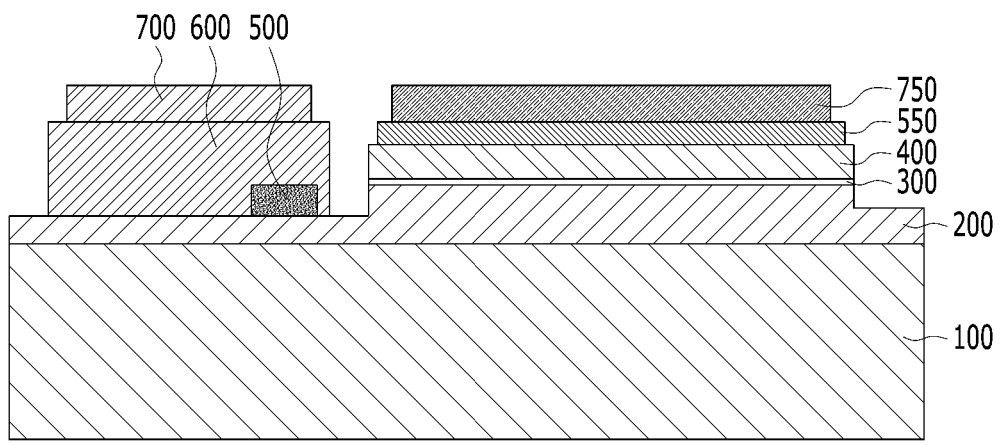

Referring to FIG. 12, first electrode pad 700 is formed on metal layer 600, and second electrode pad 750 is formed on second electrode 550. First electrode pad 700 and second electrode pad 750 may function to effectively connect contact electrode 500 and second electrode 550 to the circuit board.

Figure 13:
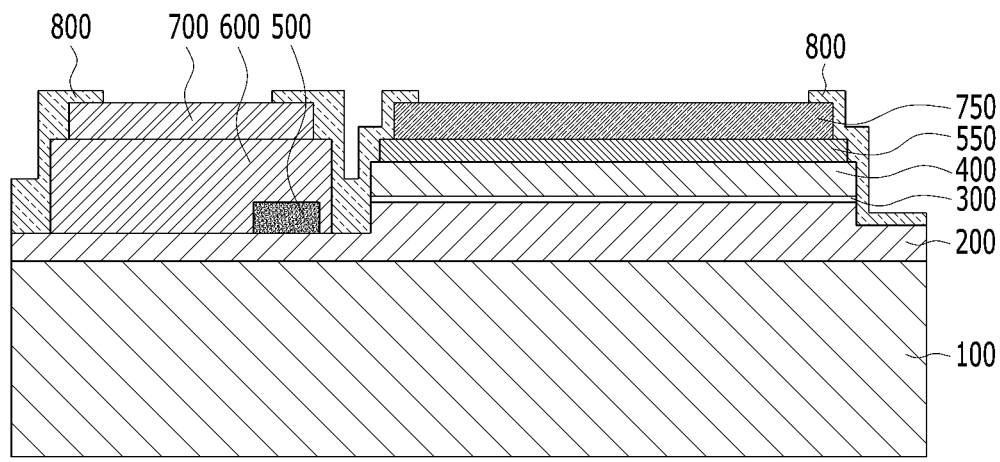

Referring to FIG. 13, insulating layer 800 is formed to partially cover a first electrode including contact electrode 500 and metal layer 600, second electrode 550, and a light emitting structure including first conductive semiconductor layer 200, active layer 300, second conductive semiconductor layer 400. Insulating layer 800 may function to electrically isolate the first electrode and second electrode 550 from each other and to protect the first electrode and second electrode 550 from external impact and contaminants.

Figure 14:
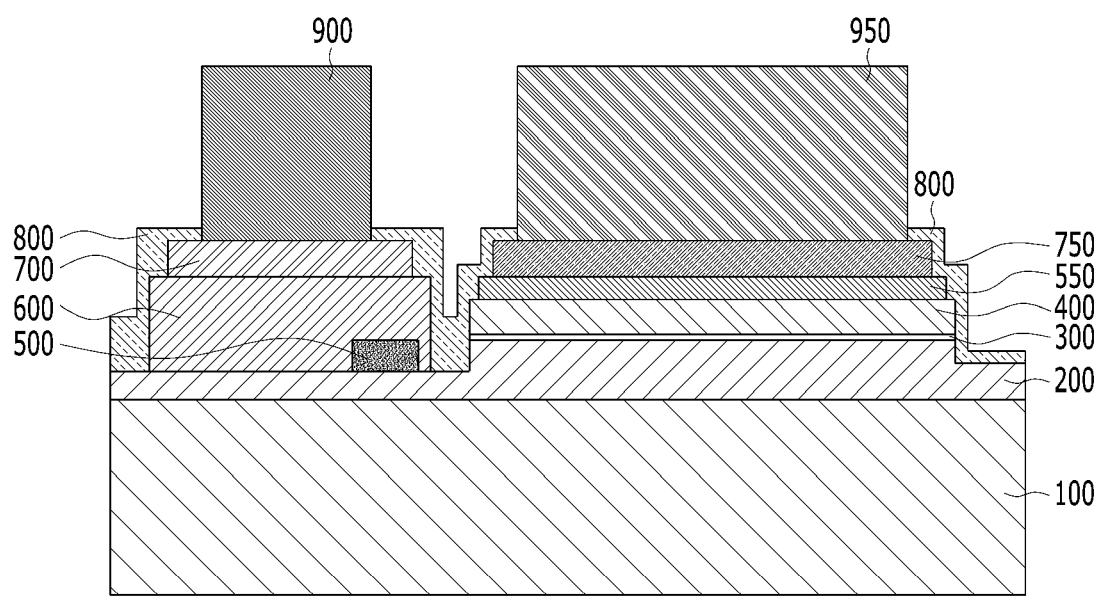

Referring to FIG. 14, first bump 900 is formed on first electrode pad 700, and second bump 950 is formed on second electrode pad 750. First bump 900 and second bump 950 may function to effectively connect the first electrode and second electrode 550 to the circuit board. In an embodiment, first bump 900 and second bump 950 may be formed together using substantially the same process.

Figure 15:
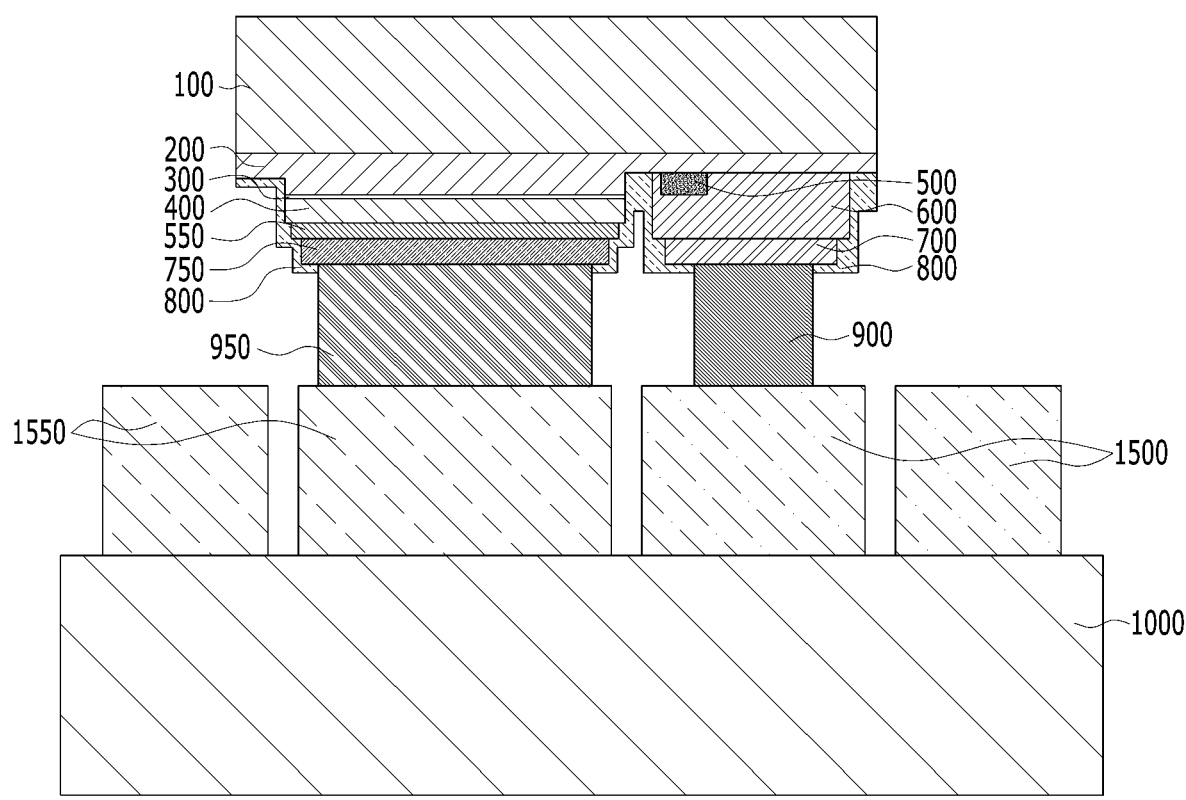

Referring to FIG. 15, semiconductor light emitting device 10 according to an embodiment of the principles of the invention is connected to circuit board 1000. First bump 900 is electrically connected to n-electrode 1500 and second bump 950 is electrically connected to p-electrode 1550 to operate semiconductor light emitting device 10.

Figure 16:
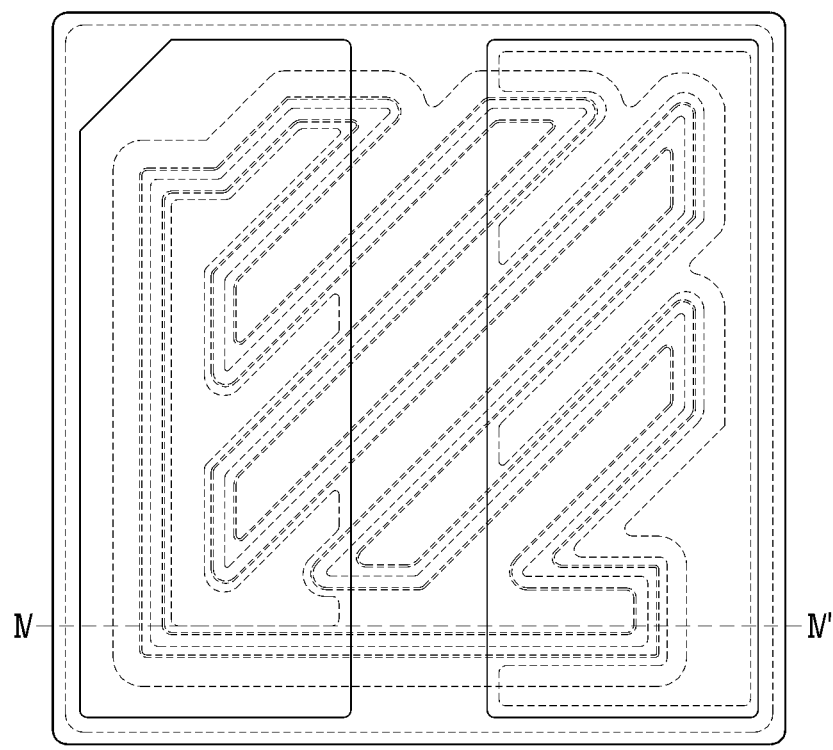
FIG. 16 is a schematic plan view of yet another embodiment of a semiconductor light emitting device constructed according to the principles of the invention.
Figure 17:
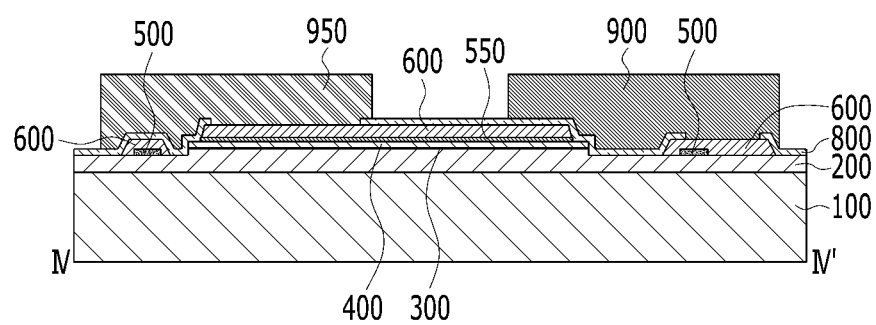
FIG. 17 is a cross-sectional view taken along sectional line IV-IV' of the semiconductor light emitting device of FIG. 16.

FIG. 16 is a schematic plan view of yet another embodiment of a semiconductor light emitting device constructed according to the principles of the invention. FIG. 17 is a cross-sectional view taken along sectional line IV-IV' of the semiconductor light emitting device of FIG. 16.

Referring to FIGS. 16 and 17, semiconductor light emitting device 10 includes substrate 100, first conductive semiconductor layer 200, active layer 300, second conductive semiconductor layer 400, contact electrode 500, second electrode 550, metal layer 600, insulating layer 800, first bump 900, and second bump 950.

Substrate 100, first conductive semiconductor layer 200, active layer 300, second conductive semiconductor layer 400, contact electrode 500, second electrode 550, metal layer 600, insulating layer 800, first bump 900 and second bump 950 are described substantially the same as substrate 100, first conductive semiconductor layer 200, active layer 300, second conductive semiconductor layer 400, contact electrode 500, second electrode 550, metal layer 600, insulating layer 800, first bump 900 and second bump 950 described with reference to FIGS. 1 and 2. Hereinafter, a duplicate description will be omitted to avoid redundancy.

Metal layer 600 may be electrically connected to contact electrode 500, and at least a part of metal layer 600 may be disposed on and in contact with first conductive semiconductor layer 200. According to an embodiment of the principles of the invention, metal layer 600 is disposed on second electrode 550, and first bump 900 and second bump 950 are disposed on metal layer 600.

First bump 900 and second bump 950 may be standardized to be directly connected to the predetermined n-electrode and p-electrode of the circuit board, and may function to effectively connect the first electrode and second electrode 550 to the circuit board.

According to the principles of the invention described above, the Ohmic contact characteristics between internal components, such as a contact electrode and a n-type semiconductor layer, of a semiconductor light emitting device may be improved due to a heat treatment at a high temperature, thereby improving forward voltage characteristic of the contact electrode with the n-type semiconductor layer. Furthermore, since the aluminum composition ratio of the contact electrode adjacent to the n-type semiconductor layer may be relatively greater than the aluminum composition ratio of the contact electrode distal from the n-type semiconductor layer, the forward voltage characteristics of the contact electrode with the n-type semiconductor layer may be improved. Therefore, light efficiency of semiconductor light emitting device may be improved, and the semiconductor light emitting device may emit DUV light more effectively by reflecting more DUV light generated in an active layer or DUV light reflected from a substrate.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A semiconductor light emitting device comprising:
a first semiconductor layer;
an active layer disposed on the first semiconductor layer to emit ultraviolet light;
a second semiconductor layer disposed on the active layer;
a first electrode including a metal layer including a first region and a second region; and
a second electrode disposed on the second semiconductor layer;
a first bump disposed on the first electrode and electrically coupled to the first semiconductor layer by the first electrode; and
a second bump disposed on the second electrode and electrically coupled to the second semiconductor layer by the second electrode,
wherein:
the first semiconductor layer includes an AlGaN layer having an energy larger than the ultraviolet wavelength energy generated in the active layer,
the active layer includes a quantum well layer and a quantum barrier layer alternately stacked and each of the quantum well layer and the quantum barrier layer includes materials having different compositions, and have a composition formula of $In_xAl_yGa_{1-x-y}N$ ($0 \leq x \leq 1$, $0 \leq y \leq 1$, $0 \leq x+y \leq 1$),
the metal layer is spaced apart from the first semiconductor layer and has a lower surface having an irregular shape electrically connected to the first semiconductor layer, and
the first electrode further includes a contact electrode disposed between the first semiconductor layer and the metal layer, and the contact electrode includes an irregular upper surface.

2. The device of claim 1, wherein the lower surface of the first region is higher than a lower surface of the second region.

3. The device of claim 1, wherein the contact electrode is closer to the second electrode than the first bump.

4. The device of claim 1, wherein the metal layer comprises a reflective layer including aluminum (Al).

5. The device of claim 4, further comprising at least one conductive barrier layer disposed on the reflective layer to prevent diffusion of metal atoms or metal ions from the reflective layer.

6. The device of claim 5, wherein the at least one conductive barrier layer includes at least one of W, TiW, Mo, Ti, Cr, Pt, Rh, Pd and Ni.

7. The device of claim 1, wherein the metal layer contacts a side surface of the first semiconductor layer.

8. A semiconductor light emitting device comprising:
a first semiconductor layer;
an active layer disposed on the first semiconductor layer to emit ultraviolet light;
a second semiconductor layer disposed on the active layer;
a first electrode disposed on the first semiconductor layer and including a first region and a second region; and
a second electrode disposed on the second semiconductor layer,
wherein:
the first semiconductor layer includes a GaN layer,
the active layer includes a quantum well layer and a quantum barrier layer alternately stacked and each of the quantum well layer and the quantum barrier layer includes materials having different compositions, and have a composition formula of $In_xAl_yGa_{1-x-y}N$ ($0 \leq x \leq 1$, $0 \leq y \leq 1$, $0 \leq x+y \leq 1$), and
the first region is spaced apart from the first semiconductor layer and has a lower surface having an irregular shape, and the second region is disposed on and in contact with the first semiconductor layer.

9. The device of claim 8, wherein the first electrode includes a metal layer having a first portion and a second portion adjacent to the first portion.

10. The device of claim 9, wherein the lower surface of the first region is higher than a lower surface of the second region.

11. The device of claim 9, wherein the metal layer comprises a reflective layer including aluminum (Al).

12. The device of claim 11, wherein the first electrode further comprises at least one conductive barrier layer disposed on the reflective layer to prevent diffusion of metal atoms or metal ions from the reflective layer.

13. The device of claim 12, wherein the at least one conductive barrier layer includes at least one of W, TiW, Mo, Ti, Cr, Pt, Rh, Pd and Ni.

* * * * *